(12) United States Patent
Li

(10) Patent No.: US 7,261,599 B2
(45) Date of Patent: Aug. 28, 2007

(54) MODULE CONNECTOR

(75) Inventor: Chao-Chang Li, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/250,961

(22) Filed: Oct. 14, 2005

(65) Prior Publication Data

US 2006/0246750 A1   Nov. 2, 2006

(30) Foreign Application Priority Data

Apr. 29, 2005   (TW) ............................. 94206862 U

(51) Int. Cl.
*H01R 13/648* (2006.01)
(52) U.S. Cl. .................................... 439/608
(58) Field of Classification Search ............. 439/608, 439/607, 108, 609, 496
See application file for complete search history.

(56) References Cited

U.S. PATENT DOCUMENTS

| | | | | |
|---|---|---|---|---|
| 4,511,201 A | * | 4/1985 | Baker et al. ............... | 439/260 |
| 6,527,593 B2 | * | 3/2003 | Handa et al. ............... | 439/676 |
| 6,692,294 B2 | * | 2/2004 | Kobayashi ................. | 439/496 |
| 6,780,055 B2 | * | 8/2004 | Shinoura et al. ........... | 439/607 |
| 6,939,172 B2 | * | 9/2005 | Lu ............................. | 439/607 |
| 7,029,308 B2 | * | 4/2006 | Wada ......................... | 439/330 |
| 7,074,085 B2 | * | 7/2006 | Chen ......................... | 439/607 |
| 7,077,664 B1 | * | 7/2006 | Wang et al. ................. | 439/70 |
| 7,086,902 B1 | * | 8/2006 | Yang ......................... | 439/607 |
| 2005/0215117 A1 | * | 9/2005 | Asai et al. ................. | 439/607 |
| 2005/0215118 A1 | * | 9/2005 | Asai et al. ................. | 439/607 |
| 2006/0063431 A1 | * | 3/2006 | Yang ......................... | 439/607 |
| 2006/0105631 A1 | * | 5/2006 | Yang ......................... | 439/607 |

* cited by examiner

Primary Examiner—Tulsidas C. Patel
Assistant Examiner—Phuongchi Nguyen
(74) Attorney, Agent, or Firm—Wei Te Chung

(57) ABSTRACT

A module connector, to which a module (5) is electrically connected, comprises a base (10) loaded with a number of terminals (2) and defining a receiving room for receiving the module; and an outer shell (4) assembled to the base after the module being accommodated in the receiving room of the base, and provided with resilient arms (44) for elastically pressing the module towards the terminals and a stop device (45) stoppable upon the base for preventing the resilient arms from being over-pressed by the module.

13 Claims, 6 Drawing Sheets

MODULE CONNECTOR

CROSS-REFERENCE TO RELATED APPLICATIONS

Relevant subject matter is disclosed in a contemporaneously filed U.S. patent entitled "MODULE CONNECTOR" which is invented by the same inventor as this patent application and assigned to the same assignee with this application.

BACKGROUND OF THE INVENTION

1. Field of the Invention

The present invention relates to a module connector in which a module body such as a memory module or a camera module is firmly fitted.

2. Description of Related Art

With development of cellular mobile phones or the likes, a lot of additional functions such as taking pictures etc. are added to the mobile phones or the likes. In order to achieve functions such as taking pictures etc., camera modules are furnished to the mobile phones or the likes in virtue of module connectors.

Generally, a camera module comprises a substantially cubic body portion and a columnar head portion extending from the body portion. Correspondingly, a modular connector for receiving the camera module usually includes an insulative housing, which defines a chamber for accommodating the body portion of the camera module, a plurality of terminals disposed in the housing for being electrically connected to the camera module, and a shell enclosing both the housing and the camera module received in the housing and defining a through hole for allowing the head portion of the camera module to protrude therefrom. A conventional module connector as shown in FIG. 1 is such a module connector, in which the shell 6 thereof is provided with a number of resilient arms 62 for elastically pressing the camera module 7 to connect with the terminals 9 and securing the camera module 7 in the housing 8. The resilient arm 62 is integrally torn from an upper wall 61 of the shell 6 with a free end thereof extending inwards to abut on the body portion 71 of the camera module 7 to urge it towards the terminals 9.

However, as there is no stop device, once the shell 6 which is downwardly assembled to the housing 8 suffers an excessive force during assembly, the resilient arms 44 will be over-pressed by the camera module 5, which may result in resilience loss of the resilient arms 44.

Hence, an improved module connector is required to overcome the disadvantages of the related art.

SUMMARY OF THE INVENTION

An object of the present invention is to provide a module connector having a resilient device for firmly securing a camera module therein, wherein resilience of the resilient device can be ensured.

Accordingly, to achieve the above-mentioned object, a module connector to which a module is electrically connected comprises a base loaded with a plurality of terminals and defining a receiving room for receiving the module; and an outer shell assembled to the base after the module being accommodated in the receiving room of the base, and provided with resilient arms for elastically pressing the module towards the terminals and a stop device stoppable upon the base for preventing the resilient arms from being excessive pressed by the module.

Other objects, advantages and novel features of the present invention will become more apparent from the following detailed description of the present embodiment when taken in conjunction with the accompanying drawings.

DETAILED DESCRIPTION OF THE INVENTION

Figure 1:
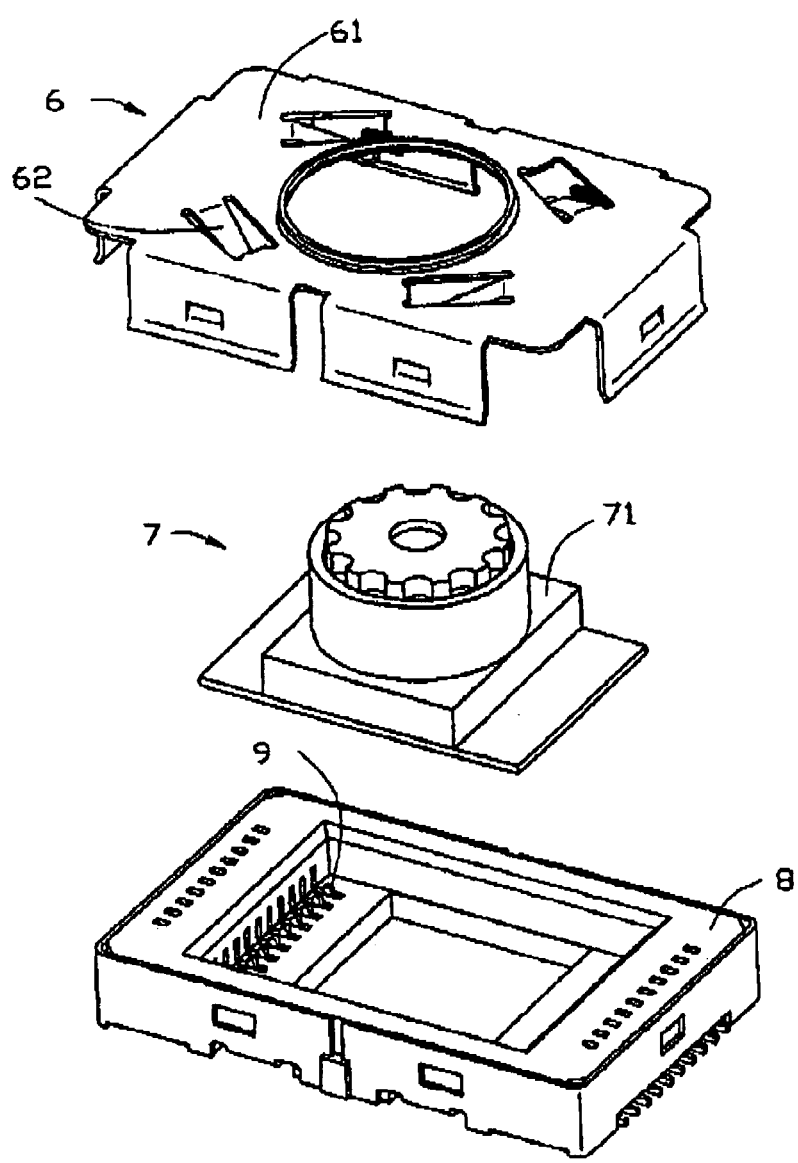
FIG. 1 is an exploded perspective view of a conventional module connector and a camera module accommodated in the module connector.
Figure 2:
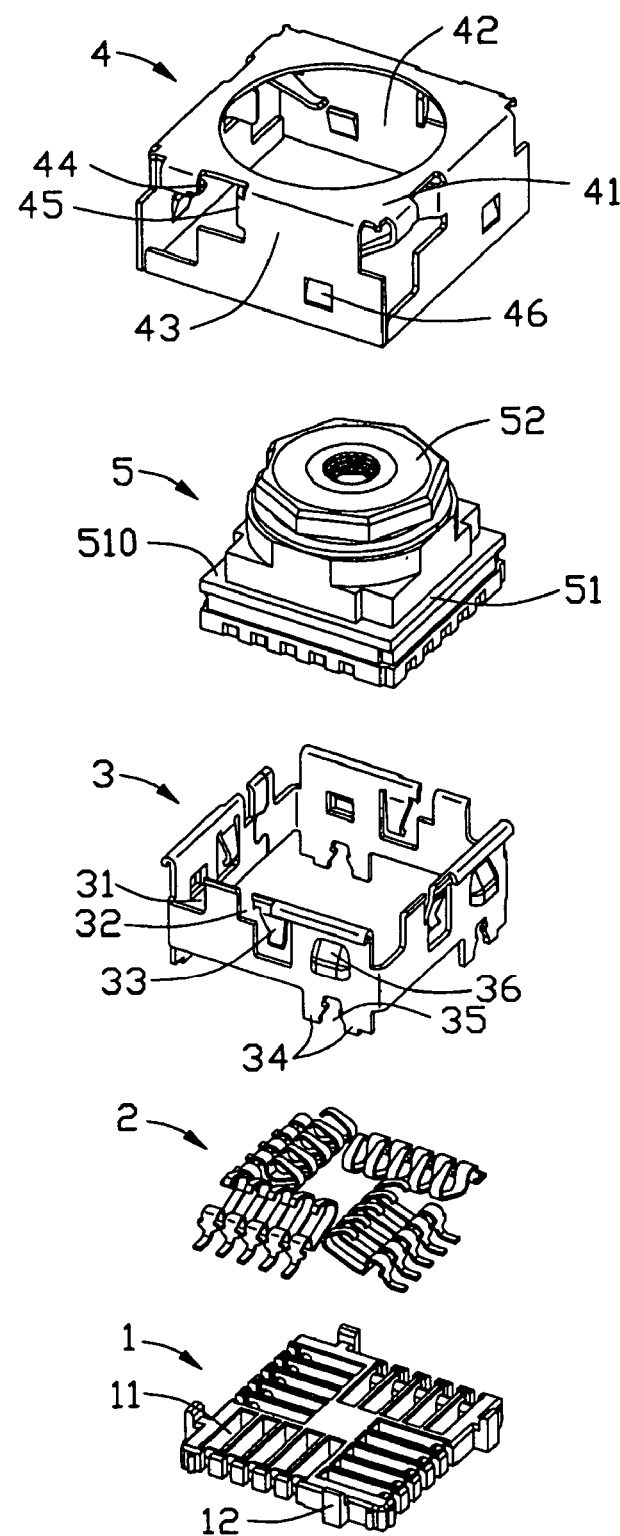
FIG. 2 is an exploded perspective view of a module connector and a camera module in accordance with a preferred embodiment of the present invention.

Reference will now be made to the drawing figures to describe the present invention in detail. Referring to FIG. 2, a module connector in accordance with the preferred embodiment of the present invention is adapted for electrically connecting a module body such as a camera module 5 with a circuit board (not shown). In fact, the module connector may also be used for other kinds of electrical components in other embodiments.

The module connector comprises a housing 1, a plurality of terminals 2 received in the housing 1, an inner shell 3, and an outer shell 4. The housing 1 is made from insulative material, and the terminals 2, the inner shell 3 and the outer shell 4 are made from conductive material, such as metal.

Figure 3:
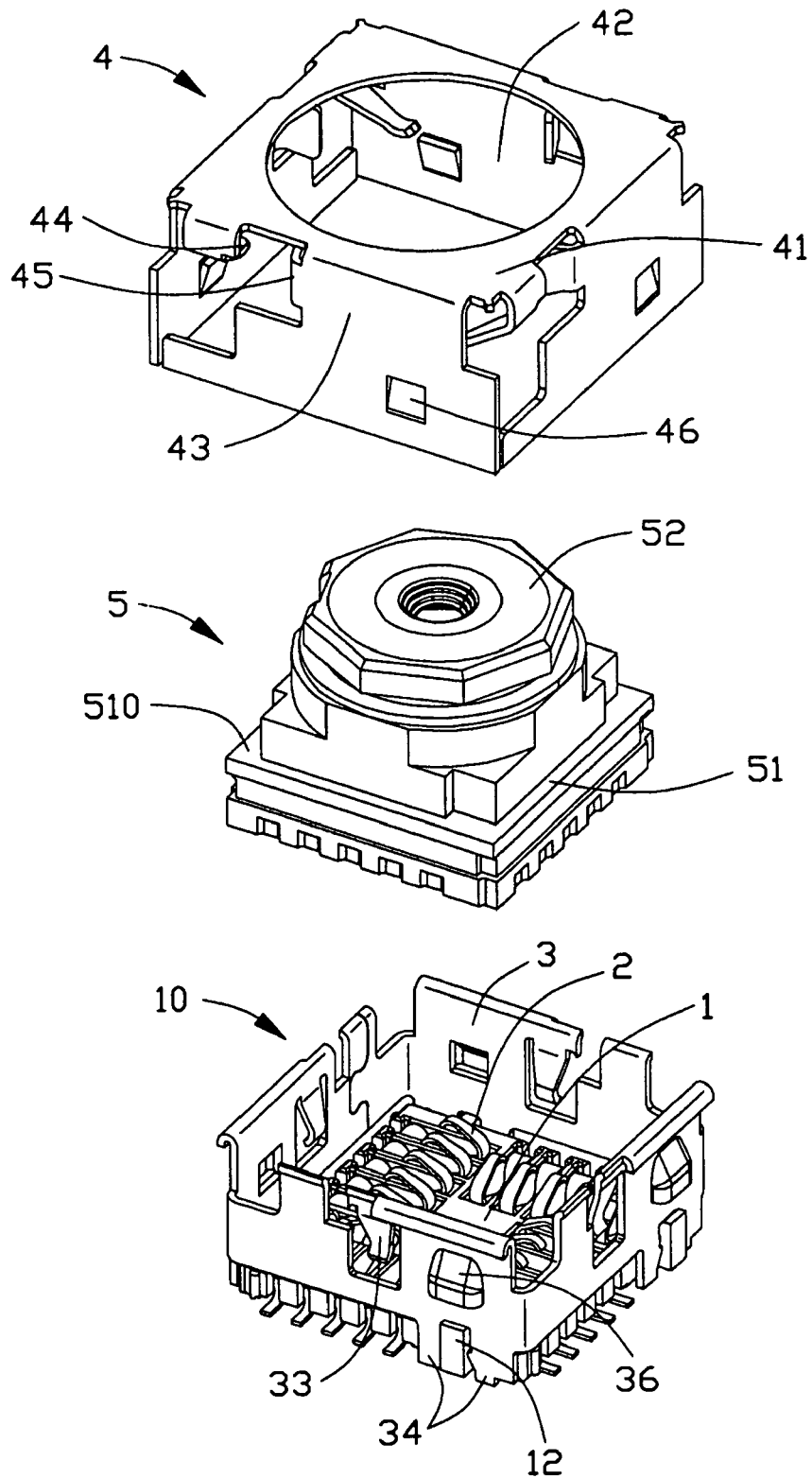
FIG. 3 is a partly assembled perspective view of the module connector and the camera module as shown in FIG. 2.

Referring to FIGS. 2 and 3, the housing 1 is a rectangular board defining a plurality of terminal receiving passageways 11 therethrough and the terminals 2 are respectively received in the passageways 11. The housing 1 is additionally provided with an upward retaining hook 12 at each sidewall thereof for engaging with and therefore retaining the inner shell 3, which will be described in detail hereafter.

The inner shell 3 is a rectangular annulation having four sidewalls, each of which is formed with a pair of soldering legs 34 integrally and downwardly extending therefrom. Each pair of soldering legs 34 defines a retaining slot 35 therebetween for engaging and interlocking with the retaining hook 12 of the housing 1 so as to securely retain the inner shell 3 to the housing 1. Additionally, each of the sidewalls of the inner shell 3 is provided with an outwards-protruding tuber 36 and an inwards-extending spring plate 33, and moreover defines a first cutout 31 and a second cutout 32.

Figure 4:
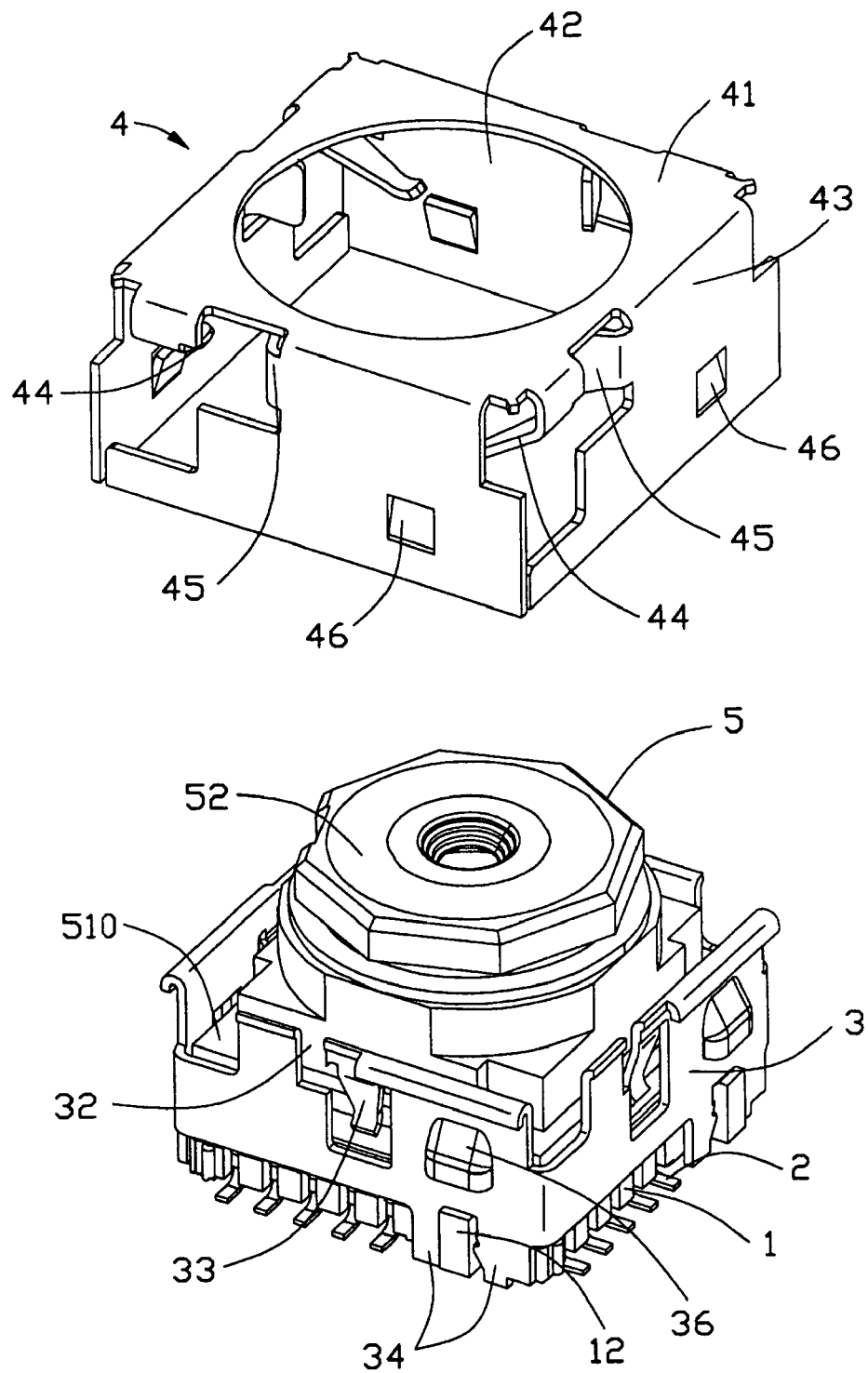
FIG. 4 is a further assembled perspective view of the module connector and the camera module as shown in FIG. 3.

While being retained to the housing 1, the inner shell 3 surrounds the housing 1 to form a base 10 for fixing the camera module 5 which comprises a stepped square body 51 and a round head 52 protruding upwards from the square body 51. The base 10 defines an upward receiving room for receiving the square body 51 of the camera module 5. As best shown in FIG. 4 after the camera module 5 is assembled in the base 10, the square body 51 is accommodated in the receiving room with side faces thereof abutting against the spring plate 33 of the inner shell 3, and the round head 52 protruding out therefrom.

Figure 5:
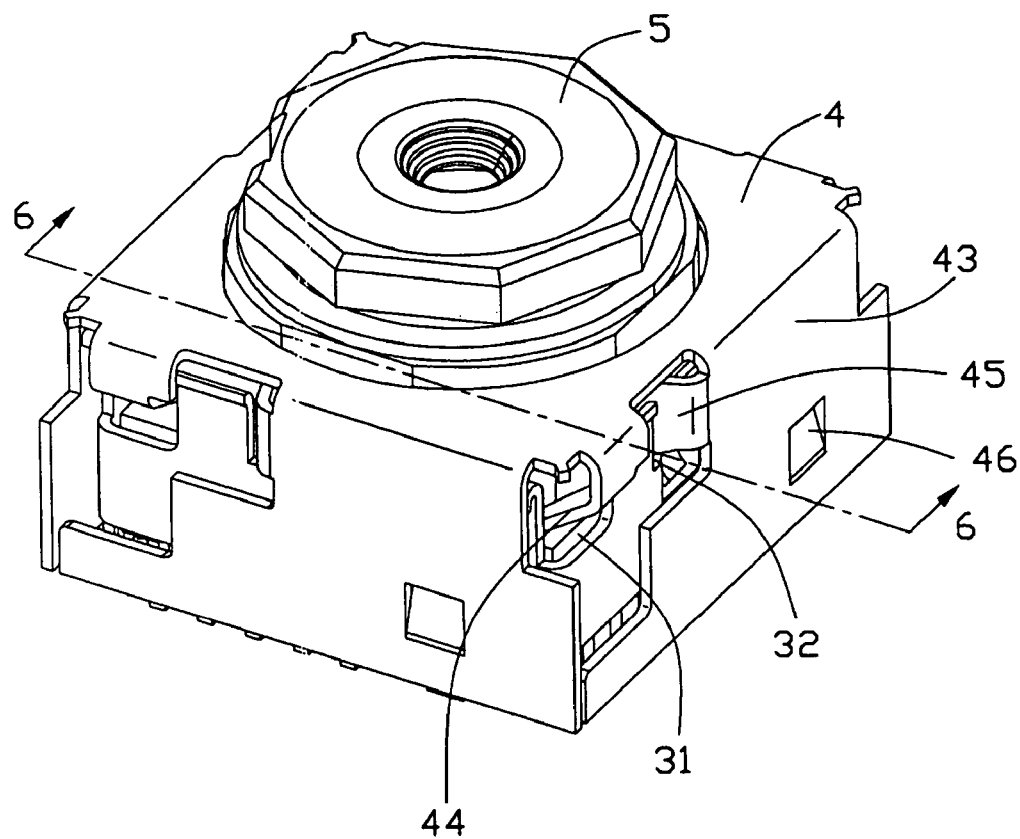
FIG. 5 is a completely assembled perspective view of the module connector and the camera module as shown in FIG. 4.
Figure 6:
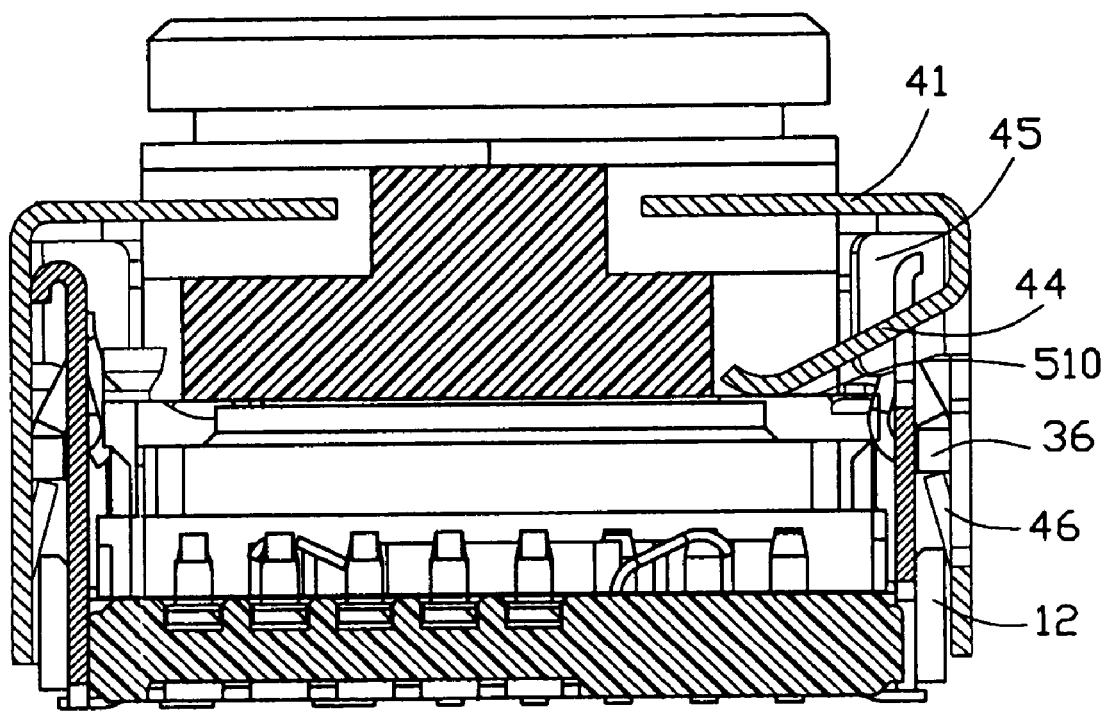
FIG. 6 is a cross-sectional view of FIG. 5 taken along line 6-6.

Then the outer shell 4 is assembled to periphery of the base 10 which is fixed with the camera module 5. The outer shell 4 is of a square box-like shape and comprises a top wall 41 and four sidewalls 43. The top wall 41 defines a through hole 42 for the round head 52 of the camera module 5 to protrude out. Each of the sidewalls 43 is provided with a resilient arm 44 and a stop piece 45 which both are inwards bent, wherein the resilient arm 44 is bent by a plate originally extending along a vertical direction and the stop piece 45 is bent by a plate originally extending along a horizontal direction. Additionally, a lock plate 46 protrudes inwards from each of the sidewalls 43. In conjunction with FIGS. 5 and 6, in assembly, the lock plate 46 is locked between the retaining hook 12 of the housing 1 and the tuber 36 of the inner shell 3. Thus the outer shell 4 is securely retained to the base 10. Meanwhile the resilient arm 44 inwards extends through the first cutout 31 to abut on a resisting face 510 of the square body 51 of the camera module 5 to elastically press the camera module 5 towards the terminals 2 received in the housing 1, and the stop piece 45 locates in the second cutout 32. As the outer shell 4 is downwardly assembled to the base 10, once the outer shell 4 suffers an excessive force during assembly, the stop piece 45 will be stopped upon a lower edge of the second cutout 32 to prevent the outer shell 4 from downwards over-moving, and thus to prevent the resilient arms 44 from being over-pressed by the camera module 5, which may result in resilience loss of the resilient arms 44.

However, the disclosure is illustrative only, changes may be made in detail, especially in matter of shape, size, and arrangement of parts within the principles of the invention.

What is claimed is:

1. A module connector, to which a module is electrically connected, comprising:
    a base loaded with a plurality of terminals and defining a receiving room for receiving the module; and
    an outer shell assembled to the base after the module being accommodated in the receiving room of the base, and the outer shell provided with resilient arms for elastically pressing the module towards the terminals and a stop device stoppable upon the base for preventing the resilient arms from being over-pressed by the module;
    wherein the outer shell comprises sidewalls forming a square and a top wall, said top wall defining a through hole for one end of the module to protrude out therefrom.

2. The module connector as described in claim 1, wherein the outer shell is made from metal material.

3. The module connector as described in claim 1, wherein the stop device is a piece integrally extending from the sidewall and is inwards bent.

4. A module connector, to which a module is electrically connected, comprising:
    a base loaded with a plurality of terminals and defining a receiving room for receiving the module; and
    an outer shell assembled to the base after the module being accommodated in the receiving room of the base, and the outer shell provided with resilient arms for elastically pressing the module towards the terminals and a stop device stoppable upon the base for preventing the resilient arms from being over-pressed by the module,
    wherein the base comprises an insulative housing and an inner shell surrounding the housing.

5. The module connector as described in claim 4, wherein the inner shell is provided with spring plates for abutting against side faces of the module.

6. The module connector as described in claim 4, wherein the inner shell defines a cutout, and the stop device is stoppable upon a lower edge of the cutout.

7. The module connector as described in claim 4, wherein the inner shell has a solder leg adapted to soldered to a printed circuit board.

8. The module connector as described in claim 7, wherein the solder leg provides a retaining slot therebetween, and the housing is formed with a retaining hook, the retaining slot engaging with the retaining hook to secure the inner shell to the housing.

9. The module connector as described in claim 8, wherein the inner shell has a tuber, and the outer shell has a lock plate locked between the tuber and the retaining hook of the housing.

10. An electrical connector assembly comprising:
    a base including an insultative enclosed by an metallic inner shell;
    a plurality of terminals disposed in the housing;
    a receiving room defined in the inner shell and above the housing;
    a module disposed in the receiving room; and
    an metallic outer shell including sidewalls latchably engaged with the inner shell; wherein
    one of said outer shell and said inner shell defines first means for laterally abutting against the module, and the other defines second means for preventing outward over-deflection of said first means.

11. The assembly as claimed in claim 10, wherein said first means extends along a first direction while the second means extends along a second direction perpendicular to said first direction.

12. The assembly as claimed in claim 10, wherein said first means is formed on the outer shell and said second means is formed on the inner shell.

13. The assembly as claimed in claim 10, wherein said outer shell defines means for downwardly abutting against the module.

* * * * *